US012703013B2

(12) United States Patent
Lin et al.

(10) Patent No.: US 12,703,013 B2
(45) Date of Patent: Aug. 11, 2026

(54) SUBSTRATE PROCESSING METHOD AND SUBSTRATE PROCESSING APPARATUS

(71) Applicant: SCREEN Holdings Co., Ltd., Kyoto (JP)

(72) Inventors: Tsungju Lin, Kyoto (JP); Hiroaki Ishii, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 18/847,643

(22) PCT Filed: Nov. 25, 2022

(86) PCT No.: PCT/JP2022/043552
§ 371 (c)(1),
(2) Date: Sep. 16, 2024

(87) PCT Pub. No.: WO2023/176052
PCT Pub. Date: Sep. 21, 2023

(65) Prior Publication Data

US 2025/0205752 A1 Jun. 26, 2025

(30) Foreign Application Priority Data

Mar. 16, 2022 (JP) ................................ 2022-041219

(51) Int. Cl.
*B08B 1/40* (2024.01)
*B08B 1/12* (2024.01)
(Continued)

(52) U.S. Cl.
CPC .................. *B08B 1/40* (2024.01); *B08B 1/12* (2024.01); *B08B 1/20* (2024.01); *B08B 1/30* (2024.01);
(Continued)

(58) Field of Classification Search
CPC .... B08B 1/40; B08B 1/30; B08B 1/20; B08B 1/12; B08B 3/041; B08B 3/08; B08B 13/00; H10P 72/0412; H10P 72/0414
See application file for complete search history.

(56) References Cited

U.S. PATENT DOCUMENTS 10,128,103 B2 * 11/2018 Chang ..................... H10P 70/54
2004/0187896 A1 * 9/2004 Konishi .............. H10P 72/0424 134/32
(Continued)

FOREIGN PATENT DOCUMENTS

JP H09-260321 A 10/1997
JP H10-022242 A 1/1998
(Continued)

OTHER PUBLICATIONS

Machine Translation of JP6890992B2 (Year: 2021).*
(Continued)

*Primary Examiner* — Sharidan Carrillo
(74) *Attorney, Agent, or Firm* — OSTROLENK FABER LLP

(57) ABSTRACT

The present invention relates to a substrate processing method and a substrate processing apparatus. A substrate processing method includes: a rinsing liquid/brush cleaning step of moving a brush exerting force onto an upper surface of a substrate from a center of the substrate toward a perimeter of the substrate while causing a fixed nozzle to discharge a rinsing liquid onto the upper surface of the substrate rotated by a holding and rotating unit; a rinsing liquid stopping step of stopping discharge of the rinsing liquid from the fixed nozzle when the brush having moved toward the perimeter of the substrate arrives at a switching position set in advance between the center of the substrate and the perimeter of the substrate; and a chemical liquid/brush cleaning step of moving, after the rinsing liquid
(Continued)

stopping step, the brush exerting force on the upper surface of the substrate from the switching position toward the perimeter of the substrate while causing the chemical liquid nozzle to discharge the chemical liquid onto the upper surface of the substrate being rotated.

7 Claims, 8 Drawing Sheets

(51) Int. Cl.

| | |
|---|---|
| ***B08B 1/20*** | (2024.01) |
| ***B08B 1/30*** | (2024.01) |
| ***B08B 3/04*** | (2006.01) |
| ***B08B 3/08*** | (2006.01) |
| ***B08B 13/00*** | (2006.01) |
| *H10P 72/00* | (2026.01) |

(52) U.S. Cl.

CPC ................ *B08B 3/041* (2013.01); *B08B 3/08* (2013.01); *B08B 13/00* (2013.01); *H10P 72/0412* (2026.01); *H10P 72/0414* (2026.01)

(56) References Cited

U.S. PATENT DOCUMENTS

| | | | | |
|---|---|---|---|---|
| 2015/0338328 | A1 * | 11/2015 | Hombo | G01N 3/56 15/102 |
| 2018/0261474 | A1 * | 9/2018 | Hokaku | H10P 72/0412 |
| 2019/0035622 | A1 | 1/2019 | Shibayama et al. | |
| 2019/0035649 | A1 | 1/2019 | Shibayama et al. | |
| 2019/0333771 | A1 | 10/2019 | Tsuda et al. | |
| 2023/0023260 | A1 | 1/2023 | Takahashi et al. | |
| 2023/0187199 | A1 * | 6/2023 | Okamura | H10P 70/15 134/42 |
| 2025/0205752 | A1 * | 6/2025 | Lin | B08B 1/40 |

FOREIGN PATENT DOCUMENTS

| | | | |
|---|---|---|---|
| JP | 2017-175062 | A | 9/2017 |
| JP | 2017-183711 | A | 10/2017 |
| JP | 2018-129470 | A | 8/2018 |
| JP | 2020-053586 | A | 4/2020 |
| TW | 202132012 | A | 9/2021 |
| TW | 202205415 | A | 2/2022 |

OTHER PUBLICATIONS

International Search Report mailed Feb. 14, 2023 in corresponding PCT International Application No. PCT/JP2022/043552.

Written Opinion mailed Feb. 14, 2023 in corresponding PCT International Application No. PCT/JP2022/043552.

Office Action mailed Mar. 30, 2023 in corresponding Application No. 111145258.

* cited by examiner

SUBSTRATE PROCESSING METHOD AND SUBSTRATE PROCESSING APPARATUS

RELATED APPLICATIONS

This application is the U.S. National Phase application under 35 U.S.C. § 371, of international Application No. PCT/JP2022/043552, filed on Nov. 25, 2022, which in turn claims the benefit of Japanese Application No. 2022-041219, filed on Mar. 16, 2022, the disclosures of which Applications are incorporated by reference herein.

TECHNICAL FIELD

The present invention relates to a substrate processing method and a substrate processing apparatus for processing a substrate. Examples of the substrate include a semiconductor substrate, a substrate for a flat panel display (FPD), a glass substrate for a photomask, a substrate for an optical disk, a substrate for a magnetic disk, a ceramic substrate, and a substrate for a solar cell. Examples of the FPD include a liquid crystal display device and an organic electroluminescence (EL) display device.

BACKGROUND ART

A conventional substrate processing apparatus includes a holding and rotating unit that rotates a substrate held in the horizontal orientation, a brush arm, a chemical liquid arm, and a pure water nozzle that discharges pure water (see, for example, Patent Literature 1 and Patent Literature 2). The brush arm includes a brush that is brought into contact with a surface of the substrate, and that performs brushing. The chemical liquid arm includes a chemical liquid nozzle through which a chemical liquid is discharged.

Such a substrate processing apparatus provides two cleaning methods. The first cleaning method is a method of cleaning the substrate by bringing the brush into contact with the substrate, while causing a pure water nozzle to discharge pure water onto a surface of the substrate being rotated. The second cleaning method is a method of cleaning the substrate, without using a brush, by causing a chemical liquid nozzle to discharge a chemical liquid onto the substrate being rotated.

CITATION LIST

Patent Literature

Patent Literature 1: JP 2017-183711 A
Patent Literature 2: JP 2017-175062 A

SUMMARY OF INVENTION

Technical Problem

However, the conventional substrate processing apparatuses have following problems. In the conventional substrate processing apparatuses, either the first cleaning method, which uses pure water and a brush, or the second cleaning method, not using a brush but a chemical liquid, alone is sometimes not quite efficient in removing particles. This point could be addressed by using a cleaning method combining the chemical liquid and the brushing. However, while the brush is at the center of the substrate, it is not possible to bring the chemical liquid nozzle above the center of the substrate, because the brush (or the brush arm) and the chemical liquid nozzle (or the chemical liquid arm) interfere with each other at the center of the substrate.

The present invention has been made in view of the situation described above, and an object of the present invention is to provide a substrate processing method and a substrate processing apparatus capable of removing particles from a substrate more efficiently, while preventing the brush and the chemical liquid nozzle from interfering each other.

Solution to Problem

In order to achieve such an object, the present invention utilizes the following configurations. That is, a substrate processing method according to the present invention is a substrate processing method for a substrate processing apparatus including: a holding and rotating unit that holds and rotates a substrate in a horizontal orientation; a brush that is movable from a center of the substrate toward a perimeter of the substrate and performs brush cleaning by exerting force onto an upper surface of the substrate; a rinsing liquid nozzle that is provided at a fixed position offset from the center of the substrate and discharges a rinsing liquid onto the upper surface of the substrate; and a chemical liquid nozzle that is movable from a retracted position offset from the center of the substrate toward the center of the substrate, and that discharges a chemical liquid downwards onto the upper surface of the substrate from above the center of the substrate, the substrate processing method comprising: a rinsing liquid/brush cleaning step of moving the brush exerting force on the upper surface of the substrate being rotated by the holding and rotating unit from the center of the substrate toward the perimeter of the substrate, while causing the rinsing liquid nozzle to discharge the rinsing liquid onto the upper surface; a rinsing liquid stopping step of stopping discharge of the rinsing liquid from the rinsing liquid nozzle when the brush having moved toward the perimeter of the substrate arrives at a switching position set in advance between the center of the substrate and the perimeter of the substrate; and a chemical liquid/brush cleaning step of moving, after the rinsing liquid stopping step, the brush exerting force on the upper surface of the substrate from the switching position toward the perimeter of the substrate while causing the chemical liquid nozzle to discharge the chemical liquid onto the upper surface of the substrate being rotated.

With the substrate processing method according to the present invention, the central part of the upper surface of the substrate is cleaned using the rinsing liquid and the brush. This way of cleaning takes advantage of the fact that, in the central part of the substrate, the particles are removed relatively efficiently by cleaning by moving the brush from the center portion of the substrate toward the perimeter of the substrate while supplying the rinsing liquid. After the rinsing liquid stops being discharged, the upper surface of the substrate is cleaned by mutual effects of chemical cleaning of the chemical liquid and the cleaning by brushing. In this manner, particles on the substrate can be removed more efficiently, in the peripheral part of the substrate. Furthermore, when the brush is at the center of the substrate, the chemical liquid nozzle for discharging the chemical liquid downwards does not need to be positioned above the center of the substrate. Therefore, it is possible to prevent the brush and the chemical liquid nozzle from interfering each other. Hence, particles can be removed from the substrate more efficiently, while preventing the brush and the chemical liquid nozzle from interfering each other.

Furthermore, with the particle removal efficiency improved, that is, with a greater cleaning power, the chuck mark formed on the rear surface of the substrate, being formed by an electrostatic chuck in an extreme ultraviolet (EUV) process, can be removed. Furthermore, compared with a processing method for sequentially performing a first cleaning using the rinsing liquid and the brush and a second cleaning with a chemical liquid without the brush, the processing time can be reduced. Furthermore, because the rinsing liquid as well as the chemical liquid are used in brush cleaning, the time for which the brush is exposed to the chemical liquid is reduced. Therefore, the lifetime of the brush can be extended. Furthermore, because the chemical liquid is not supplied while the brush is exerting force on the central part of the substrate, the used amount of chemical liquid can be reduced.

Furthermore, in the substrate processing method described above, preferably, the rinsing liquid/brush cleaning step, the rinsing liquid stopping step, and the chemical liquid/brush cleaning step are repeated a preset number of times. With the chemical liquid being supplied on the upper surface of the substrate, the adhesion force of particles is decreased, so that the particles can be easily removed by brush cleaning. Therefore, by repeating the rinsing liquid/brush cleaning step, the rinsing liquid stopping step, and the chemical liquid/brush cleaning step, the efficiency of particle removal is improved.

Preferably, the substrate processing method further includes a first chemical liquid nozzle moving step of moving the chemical liquid nozzle to a preset position above the substrate, the preset position being a position not interfering with the brush, before the brush exerts force onto the upper surface of the center of the substrate. It is possible to keep the distance for moving the chemical liquid nozzle short, when the chemical liquid nozzle is moved to above the center of the substrate.

Preferably, the substrate processing method further includes a second chemical liquid nozzle moving step of moving the chemical liquid nozzle to above the center of the substrate when the brush having moved toward the perimeter of the substrate arrives at the switching position, and the switching position is a position where the brush does not interfere with the chemical liquid nozzle positioned above the center of the substrate. The chemical liquid nozzle is allowed to move when the brush arrives at the switching position where the brush does not interfere with the chemical liquid nozzle.

Preferably, the substrate processing method further includes a third chemical liquid nozzle moving step of moving the chemical liquid nozzle to above the center of the substrate while the rinsing liquid/brush cleaning step is being performed, in a manner maintaining the chemical liquid nozzle not interfering with the brush. In this manner, it is possible for the chemical liquid nozzle to discharge the chemical liquid onto the center of the substrate immediately after the brush arrives at the switching position and the rinsing nozzle stops discharging the rinsing liquid.

In the chemical liquid/brush cleaning step of the substrate processing method described above, the brush exerting force on the upper surface of the substrate is moved from the switching position toward the perimeter of the substrate while causing the chemical liquid nozzle to discharge the chemical liquid onto the upper surface of the substrate in a manner allowing the chemical liquid landed on the upper surface of the substrate being rotated to cover the center of the substrate. With the rotation of the substrate, the chemical liquid on the substrate is allowed to spread evenly from the center of the substrate.

In the substrate processing method described above, preferably, the brush is configured to perform brushing by exerting force while in contact with the upper surface of the substrate. With this, it is possible to clean the upper surface of the substrate by mutual effects of chemical cleaning of the chemical liquid and the physical cleaning of the brush.

A substrate processing apparatus according to the present invention includes: a holding and rotating unit that holds and rotates a substrate in a horizontal orientation; a brush that is movable from a center of the substrate toward a perimeter of the substrate and performs brush cleaning by exerting force on an upper surface of the substrate; a brush moving mechanism that moves the brush; a rinsing liquid nozzle that is provided at a fixed position offset from the center of the substrate and discharges a rinsing liquid onto the upper surface of the substrate; a chemical liquid nozzle that is movable from a retracted position offset from the center of the substrate toward the center of the substrate, and that discharges a chemical liquid downwards onto the upper surface of the substrate from above the center of the substrate; and a control unit, in which the control unit causes the brush moving mechanism to move the brush exerting force on the upper surface of the substrate being rotated by the holding and rotating unit from the center of the substrate toward the perimeter of the substrate, while causing the rinsing liquid nozzle to discharge the rinsing liquid onto the upper surface, the control unit stops causing the rinsing liquid nozzle to discharge the rinsing liquid when the brush having moved toward the perimeter of the substrate arrives at a switching position set in advance between the center of the substrate and the perimeter of the substrate, and, after the rinsing liquid stopping step, the control unit causes the brush moving mechanism to move the brush exerting force onto the upper surface of the substrate from the switching position toward the perimeter of the substrate while causing the chemical liquid nozzle to discharge the chemical liquid onto the upper surface of the substrate being rotated.

Advantageous Effects of Invention

With the substrate processing method and the substrate processing apparatus according to the present invention, it is possible to remove particles from a substrate more efficiently, while preventing the brush and the chemical liquid nozzle from interfering each other.

BRIEF DESCRIPTION OF DRAWINGS

FIG. 4(*b*) is a side view of FIG. 4(*a*); FIG. 4(*c*) is a plan view for explaining a rinsing liquid/brushing process; FIG. 4(*d*) is a side view of FIG. 4(*c*); FIG. 4(*e*) is a plan view for explaining a chemical liquid/brushing process; and FIG. 4(*f*) is a side view of FIG. 4(*e*).

EMBODIMENT

Figure 1:
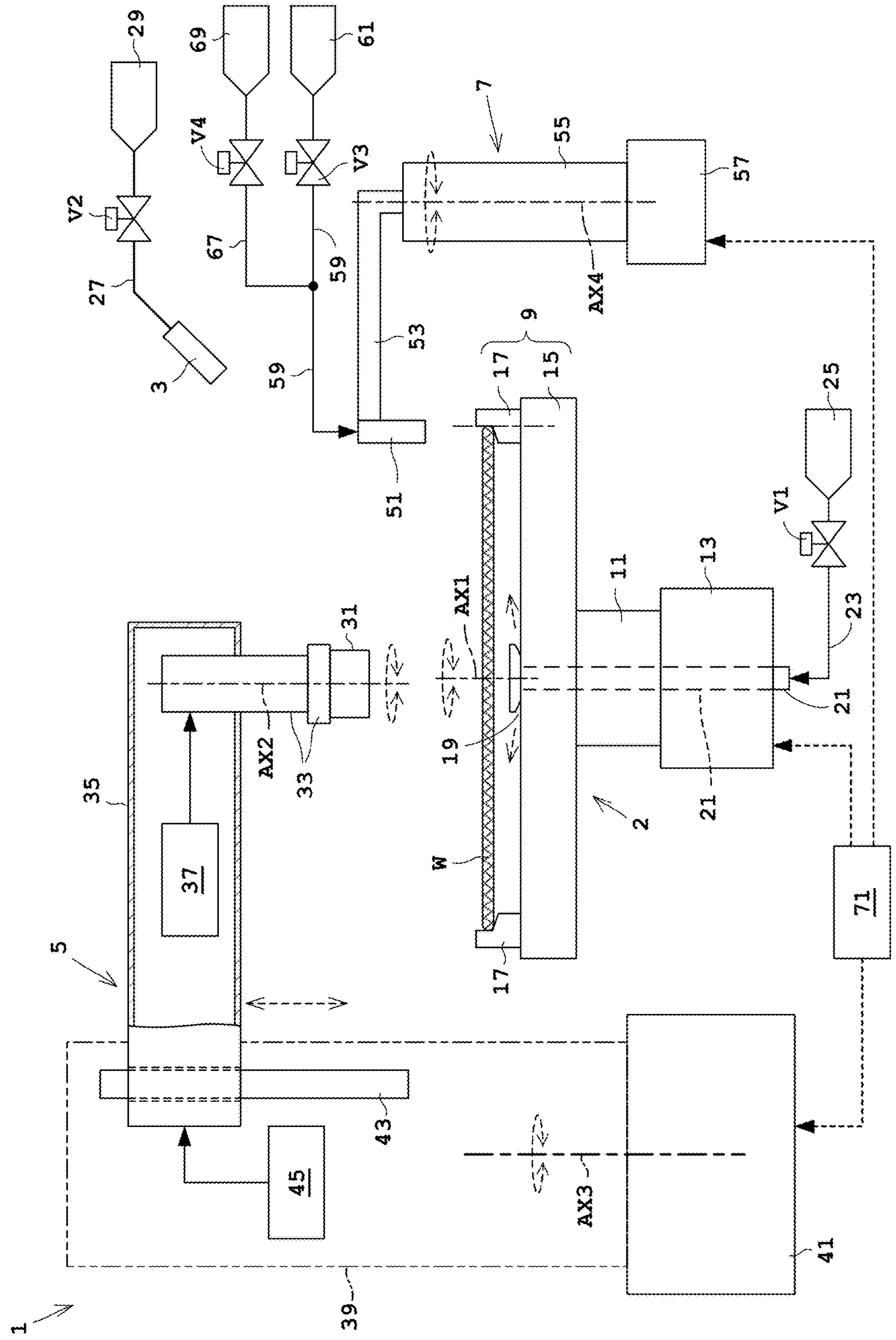
FIG. 1 is a diagram illustrating a schematic configuration of a substrate processing apparatus according to an embodiment.
Figure 2:
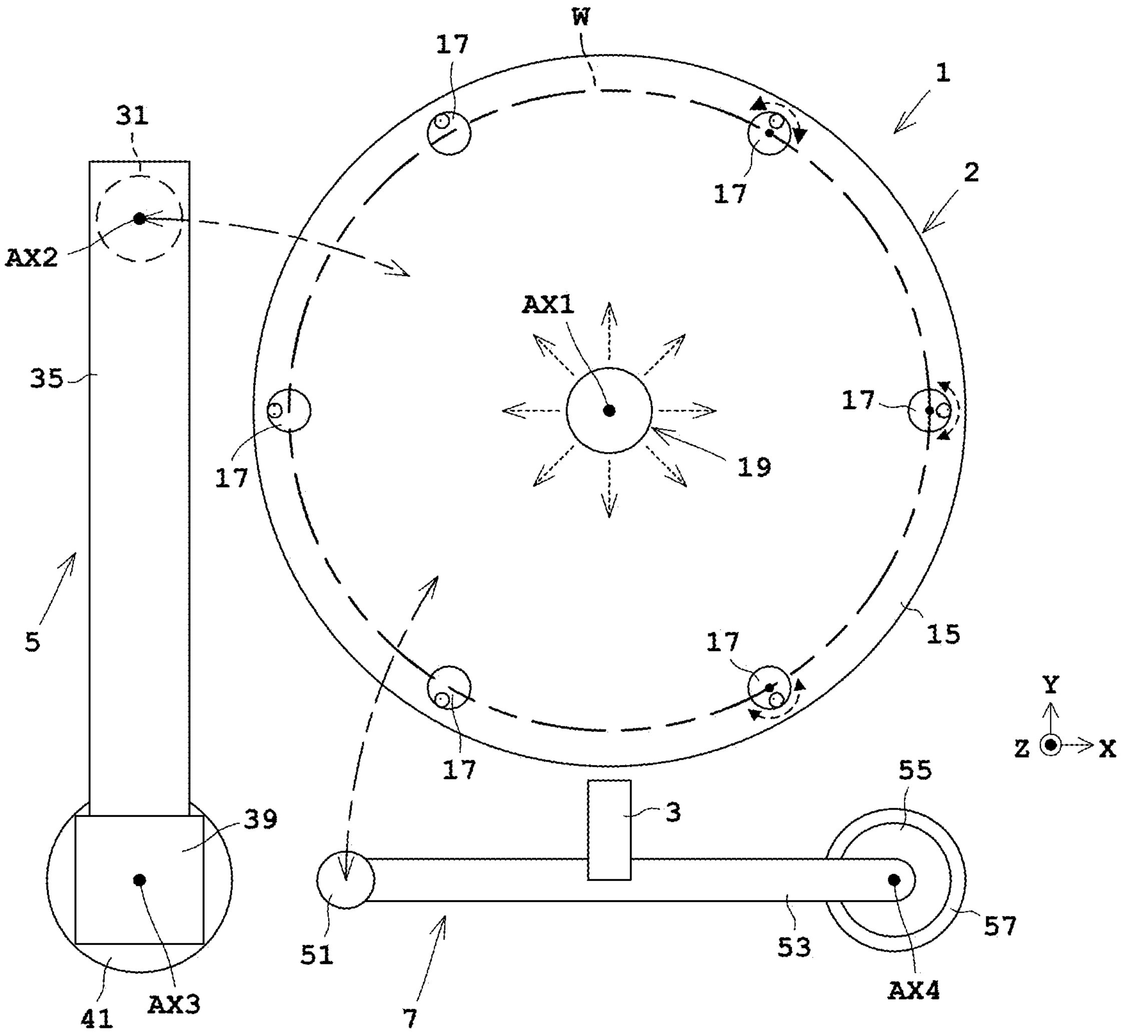
FIG. 2 is a plan view of the substrate processing apparatus.

An embodiment of the present invention will now be described with reference to drawings. FIG. 1 is a diagram illustrating a schematic configuration of a substrate processing apparatus. FIG. 2 is a plan view of the substrate processing apparatus.

(1) Configuration of Substrate Processing Apparatus

A configuration of the substrate processing apparatus 1 will be described with reference to FIGS. 1 and 2. The substrate processing apparatus 1 includes a holding and rotating unit 2, a fixed nozzle 3, a brush arm 5, and a chemical liquid arm 7. The holding and rotating unit 2 holds and rotates the substrate W in a horizontal orientation. The substrate W has a disk-like shape. In this embodiment, the diameter of the substrate W is 300 mm as an example, but is not limited to this size.

The holding and rotating unit 2 includes a spin chuck 9, a rotation shaft 11, and a rotation drive unit 13. The rotation drive unit 13 includes an electric motor. The rotation drive unit 13 rotates the spin chuck 9 about a vertical axis AX1 via the rotation shaft 11.

The spin chuck 9 includes a spin base 15 and three or more (e.g., six) holding pins 17. The spin base 15 has a disk-like shape. The vertical axis AX1 passes through the center of the spin base 15. The three or more holding pins 17 stand upright in a ring-like shape, at equal intervals around the vertical axis AX1. Some or all of the three or more holding pins 17 are configured to be movable. Each of the holding pins 17 that are movable rotates about its vertical axis passing therethrough. With this, the spin chuck 9 holds the substrate W by holding the side surface of the substrate W with the three or more holding pins 17. The spin chuck 9 may also be configured to hold the substrate W by suctioning the bottom surface of the substrate W.

The holding and rotating unit 2 includes a gas outlet 19, a gas feeder pipe 21, a gas delivery pipe 23, a gas source 25, and an on-off valve V1. The gas outlet 19 has a ring-shaped slit, and discharges gas substantially in the entire horizontal directions from the vertical axis AX1. The gas feeder pipe 21 sends gas to the gas outlet 19. The gas feeder pipe 21 is provided in a manner penetrating the rotation shaft 11 and the rotation drive unit 13 along the vertical axis AX1.

The gas delivery pipe 23 delivers the gas (e.g., an inert gas such as nitrogen) from the gas source 25 to the gas feeder pipe 21. The on-off valve V1 is provided to the gas delivery pipe 23. While the on-off valve V1 is open, the gas is discharged from the gas outlet 19. When the on-off valve V1 is closed, the gas outlet 19 stops discharging gas. The gas outlet 19 discharges the gas in such a manner that the gas flows from the center of the substrate W toward the perimeter (outer edge) of the substrate W, inside the space between the substrate W and the spin base 15.

The fixed nozzle 3 discharges pure water (rinsing liquid) diagonally downwards with respect to the top surface of the substrate W. As the pure water, deionized water (DIW) is used, for example. The fixed nozzle 3 is provided at a fixed position offset from the center of the substrate W. The position where the fixed nozzle 3 is fixed is such a position that the movements of a brush 31 and a chemical liquid nozzle 51, which will be described later, are not obstructed. In this embodiment, the fixed nozzle 3 is provided outside the substrate W held by the holding and rotating unit 2. As illustrated in FIG. 2, the fixed nozzle 3 is provided between a brush turning mechanism 41 and a nozzle turning mechanism 57, which will be described later. The fixed nozzle 3 is configured not to move in the horizontal direction, but may also be configured movable in the horizontal direction. The fixed nozzle 3 may also be configured not to be turned about a predetermined vertical axis, or may be configured not to be moved up or down. The fixed nozzle 3 corresponds to a rinsing liquid nozzle according to the present invention.

A tip end of a pure water pipe 27 is connected to the fixed nozzle 3. A base end of the pure water pipe 27 is connected to a pure water source 29. The pure water pipe 27 sends pure water from the pure water source 29 into the fixed nozzle 3. The pure water pipe 27 has an on-off valve V2. While the on-off valve V2 is open, the pure water is discharged from the fixed nozzle 3. When the on-off valve V2 is closed, the fixed nozzle 3 stops discharging the pure water.

The brush arm 5 includes a brush 31, a shaft 33, a brush arm body 35, and an electric motor 37. The brush 31 comes into contact with the upper surface of the substrate W to perform brush cleaning. The brush 31 is made of a fluororesin such as polytetrafluoroethylene (PTFE). The brush 31 has a columnar shape. The brush 31 is a member having a hardness that is not soft like a sponge, and but slightly deforms by being pushed.

The upper end of the brush 31 is attached to the lower end of the shaft 33 extending in the vertical direction. The shaft 33 has an upper portion held rotatably about a vertical axis AX2 by the brush arm body 35 extending in the horizontal direction. The electric motor 37 rotates the shaft 33 about the vertical axis AX2 via a belt or a gear, for example. The brush 31 and the shaft 33 are provided on the tip-end side of the brush arm body 35.

The brush arm 5 includes a lift mechanism (linear actuator) 39 and a brush turning mechanism 41. The lift mechanism 39 moves elements such as the brush 31 and the brush arm body 35 up and down. The lift mechanism 39 includes a guide rail 43 and a drive unit 45. The guide rail 43 supports the base end of the brush arm body 35 in a manner up and down movable. The guide rail 43 guides the brush arm body 35 in the up and down directions. The drive unit 45 includes, for example, an electric motor and a screw shaft.

Note that the drive unit 45 may include an air cylinder and an electropneumatic regulator, instead of the electric motor or the like. The electropneumatic regulator supplies gas such as air at a pressure set on the basis of an electric signal from the control unit 71, to be described later, to the air cylinder.

The brush turning mechanism 41 is provided outside the substrate W being held by the holding and rotating unit 2. The brush turning mechanism 41 turns the brush 31, the brush arm body 35, the lift mechanism 39, and the like about a vertical axis AX3. That is, the brush turning mechanism 41 can move the brush 31 from the center of the substrate W toward the perimeter of the substrate W. The brush turning mechanism 41 includes an electric motor. As illustrated in FIG. 2, a standby position of the brush 31 is positioned in the +Y direction of the brush turning mechanism 41. The brush turning mechanism 41 corresponds to a brush moving mechanism according to the present invention.

The chemical liquid arm 7 includes a chemical liquid nozzle 51, an arm body 53, a turning shaft 55, and a nozzle turning mechanism 57. The chemical liquid nozzle 51 discharges the chemical liquid downwards onto the top surface of the substrate W.

A tip end of a chemical liquid pipe 59 is connected to the chemical liquid nozzle 51. A base end of the chemical liquid pipe 59 is connected to a chemical liquid source 61. The chemical liquid pipe 59 sends a chemical liquid from the chemical liquid source 61 to the chemical liquid nozzle 51. The chemical liquid pipe 59 is provided with an on-off valve V3. When the on-off valve V3 is open and the on-off valve V4 is closed, the chemical liquid is discharged from the chemical liquid nozzle 51. When the on-off valve V3 is closed, the chemical liquid nozzle 51 stops discharging the chemical liquid.

The chemical liquid nozzle 51 can also discharge pure water (e.g., DIW), as well as the chemical liquid. That is, the chemical liquid nozzle 51 is enabled to supply the chemical liquid and pure water, selectively. The tip end of a second pure water pipe 67 is communicably connected to the chemical liquid pipe 59, at a position between the chemical liquid nozzle 51 and the on-off valve V3. A base end of the second pure water pipe 67 is connected to a second pure water source 69. The second pure water pipe 67 sends the pure water from the second pure water source 69 to the chemical liquid nozzle 51, via the chemical liquid pipe 59. The second pure water pipe 67 is provided with an on-off valve V4. When the on-off valve V4 is open and the on-off valve V3 is closed, the pure water is discharged from the chemical liquid nozzle 51. When the on-off valve V4 is closed, the chemical liquid nozzle 51 stops discharging the pure water. The chemical liquid pipe 59 and the second pure water pipe 67 are disposed in a manner passing through the inside of the arm body 53 and inside of the turning shaft 55.

As the chemical liquid, for example, SC1, ozone-containing hydrofluoric acid solution (FOM), hydrofluoric acid (HF), diluted aqueous ammonia ($dNH_4OH$), or diluted hydrofluoric acid (DHF), which is a solution obtained by diluting hydrofluoric acid with water, is used. SC1 is a liquid mixture of ammonia, hydrogen peroxide water ($H_2O_2$), and water. The ratio of ammonia, hydrogen peroxide water, and water is, for example, 1:8:60. The FOM is a liquid mixture of hydrofluoric acid and ozonated ($O_3$) water.

The chemical liquid nozzle 51 is provided at a tip end of the arm body 53. The arm body 53 extends in the horizontal direction. A base end of the arm body 53 is connected to an upper portion of the turning shaft 55. The turning shaft 55 extends in the vertical direction. The nozzle turning mechanism 57 is provided under the turning shaft 55.

The nozzle turning mechanism 57 includes an electric motor. When the nozzle turning mechanism 57 causes the turning shaft 55 to rotate about a vertical axis AX4, the chemical liquid nozzle 51 and the arm body 53 are caused to turn about the vertical axis AX4. It is also possible for the chemical liquid arm 7 to include an electric motor for moving the chemical liquid nozzle 51 up and down.

In FIG. 2, the standby position of the chemical liquid nozzle 51 is at a position near the brush turning mechanism 41, and in the −X direction of the nozzle turning mechanism 57. When the brush 31 and the chemical liquid nozzle 51 are at their standby positions, the brush arm 5 and the chemical liquid arm 7 are disposed in an L shape in plan view, as illustrated in FIG. 2.

The description will now return to FIG. 1. The substrate processing apparatus 1 includes a control unit 71 and a storage unit (not illustrated). The control unit 71 controls each component included in the substrate processing apparatus 1. The control unit 71 includes one or more processors such as a central processing unit (CPU). The storage unit includes at least one of a read-only memory (ROM), a random-access memory (RAM), and a hard disk, for example. The storage unit stores therein a computer program required in controlling each of the components included in the substrate processing apparatus 1.

(2) Operation of Substrate Processing Apparatus 1 (Rear Surface Cleaning)

An operation of the substrate processing apparatus 1 will now be described with reference to the timing chart illustrated in FIG. 3. Note that the rear surface of the substrate W refers to the surface without any electronic circuit, with respect to a front surface having electronic circuits (device surface) on the substrate W.

A transfer robot, not illustrated, transfers the substrate W with the rear surface facing upwards, onto the holding and rotating unit 2. The holding and rotating unit 2 then holds the substrate W (time to).

The on-off valve V1 is then operated to open. As a result, the gas is discharged from the gas outlet 19 in a manner flowing from the center of the substrate W toward the perimeter (outer edge) of the substrate W, inside the space between the substrate W and the spin base 15. In this manner, it is possible to prevent the chemical liquid from reaching the bottom surface (device surface) of the substrate W, for example.

At time t1, the holding and rotating unit 2 starts rotating the substrate W around the vertical axis AX1. (see FIG. 1). At the time t1, the nozzle turning mechanism 57 of the chemical liquid arm 7 moves the chemical liquid nozzle 51 from the standby position outside the substrate W to a position above the center of the substrate W. At time t2 to time t14, the substrate W is rotated at 500 rpm, for example.

At time t3, the on-off valve V2 is operated to open. As a result, pure water (e.g., DIW) is discharged from the fixed nozzle 3 to the upper surface (back surface) of the substrate W being rotated by the holding and rotating unit 2. The pure water from the fixed nozzle 3 lands near the center of the substrate W. In other words, the pure water is lands at a position where the pure water discharged from the fixed nozzle 3 does not hit the brush 31 directly, when the brush 31 is in contact with the center of the substrate W.

The pure water having landed near the center of the substrate W spreads and covers the center of the substrate W. The pure water also spreads across the substrate W due to the rotation of the substrate W, and extra pure water is removed off of the substrate W.

Figure 4:
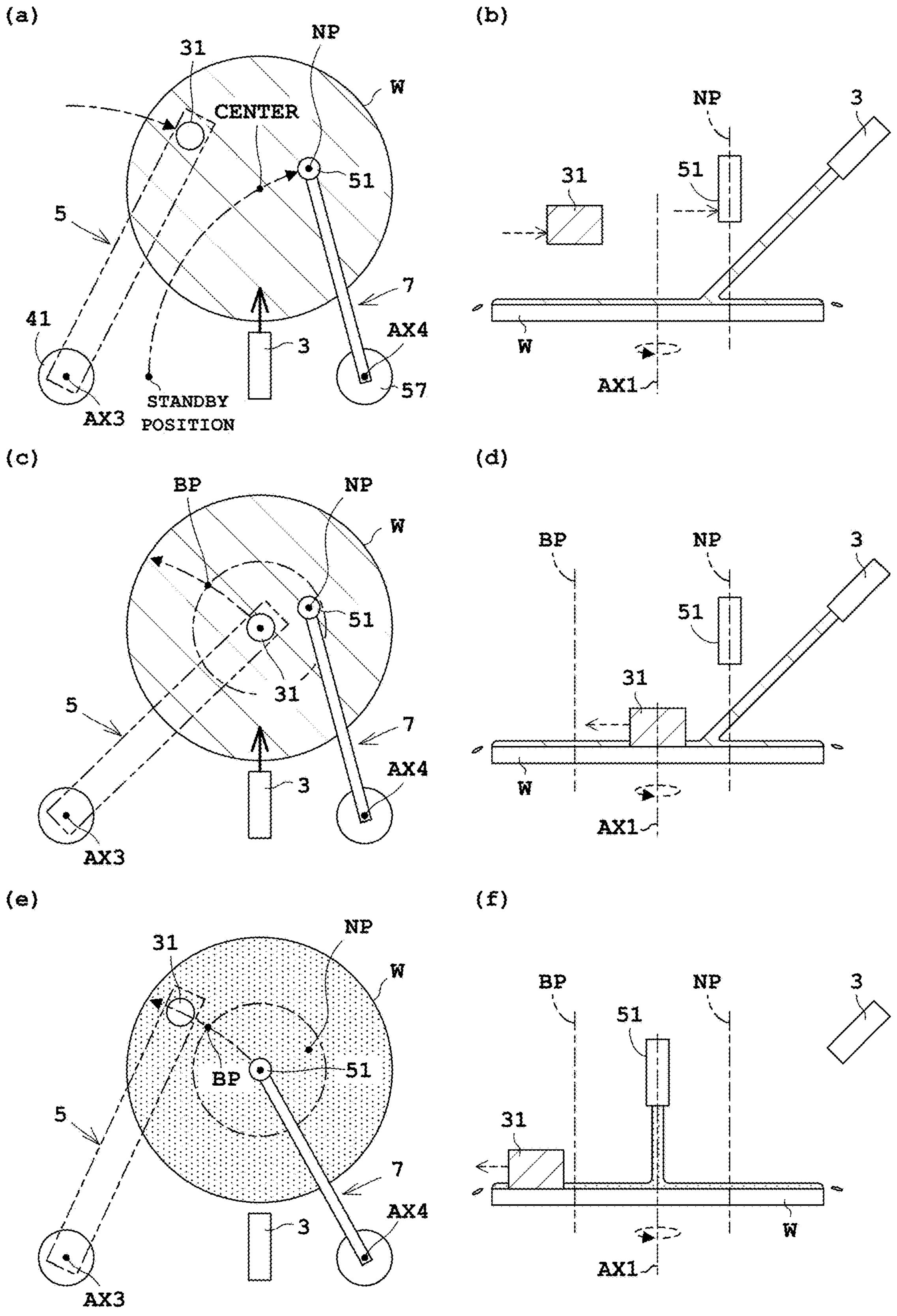
FIG. 4(*a*) is a plan view for explaining an example of a retracted position of a chemical liquid nozzle.

At the time t3, the nozzle turning mechanism 57 also moves the chemical liquid nozzle 51 from the position above the center of the substrate W to a preset position NP (see FIGS. 4(*a*) and 4(*b*)).

The control unit 71 moves the chemical liquid nozzle 51 above the center of the substrate W, before moving the brush 31 above the center of the substrate W. The control unit 71 also moves the chemical liquid nozzle 51 to the preset position NP above the substrate W and not interfering with the brush 31 (first chemical liquid nozzle moving step) before the brush 31 is brought into contact with the upper surface of the center of the substrate W at a time t5, to be described later. As a result, the chemical liquid nozzle 51 can be moved to the position NP so as not to interfere with the brush 31. Furthermore, when the brush 31 is moved from the center of the substrate W toward the perimeter of the substrate W, the chemical liquid nozzle 51 can be smoothly moved from the position NP to above the center of the substrate W.

The position NP where the chemical liquid nozzle 51 is moved is set on the opposite side of the standby position of the chemical liquid nozzle 51, with respect to the center of the substrate W. That is, in plan view, the center of the substrate W is on the path along which the chemical liquid nozzle 51 moves between the position NP and the standby position of the chemical liquid nozzle 51. In FIG. 4(*b*), for the convenience of illustration, the fixed nozzle 3 is illustrated on the right side in FIG. 4(*b*).

The position NP is a position offset from the center of the substrate W and is a preset position. The position NP is a position at which the brush 31 (or the brush arm 5) and the chemical liquid nozzle 51 (or the chemical liquid arm 7) do not interfere with each other. For example, the position NP is set at a position 60 mm away from the center of the substrate W in plan view. When the size of the brush 31 or the brush arm 5 is small, for example, the position NP may be set at a position 10 mm away from the center of the substrate W.

Also at the time t3, the brush turning mechanism 41 moves the brush 31 from the standby position outside the substrate W to above the center of the substrate W. The brush 31 and the chemical liquid nozzle 51 are moved in such a manner that the brush 31 and the chemical liquid nozzle 51 do not interfere with (come into contact with) each other.

Then, between time t4 and time t5, the lift mechanism 39 of the brush arm 5 starts lowering the brush 31. At the time t5, the lift mechanism 39 starts the brush cleaning by bringing the brush 31 into contact with the upper surface of the substrate W, at the center of the substrate W. The brush turning mechanism 41 moves the brush 31 substantially simultaneously with the brush 31 coming into contact with the upper surface of the substrate W (see FIGS. 4(*c*) and 4(*d*)).

That is, the control unit 71 moves the brush 31 from the center of the substrate W toward the perimeter of the substrate W, while keeping the brush 31 in contact with the upper surface of the substrate W and discharging pure water from the fixed nozzle 3 onto the upper surface (back surface) of the substrate W being rotated (rinsing liquid/brush cleaning step). During the brush cleaning, the electric motor 37 rotates the brush 31 about the vertical axis AX2.

Then, when the brush 31 having moved toward the perimeter of the substrate W arrives at the switching position BP, at time t6, the on-off valve V2 is operated to close, so that the discharge of the pure water from the fixed nozzle 3 stops (rinsing liquid stopping step).

The switching position BP is set in advance between the center of the substrate W and the perimeter of the substrate W. For example, assuming that the substrate W has a radius of 150 mm, the switching position BP is set at 75 mm from the center of the substrate W, which is the position at a half of the radius. The switching position BP is set in such a manner that the brush 31 and the chemical liquid nozzle 51 do not interfere with each other when the chemical liquid nozzle 51 is above the center of the substrate W (including near above in the vertical direction).

At time t6 to time t7, after the pure water stops being discharged, the brush 31 exerting force onto the upper surface of the substrate W is moved from the switching position BP toward the perimeter of the substrate W, while the chemical liquid nozzle 51 is caused to discharge the chemical liquid onto the upper surface of the substrate W being rotated (chemical liquid/brush cleaning step, see FIGS. 4(*e*) and 4(*f*)).

The operation will be explained specifically. When the brush 31 having moved toward the perimeter of the substrate W arrives at the switching position BP (time t6), the nozzle turning mechanism 57 starts moving the chemical liquid nozzle 51 from above the position NP to above the center of the substrate W. When the chemical liquid nozzle 51 arrives above the center of the substrate W (above in the vertical direction), the chemical liquid is discharged from the chemical liquid nozzle 51 onto the upper surface of the substrate W at the center of the substrate W. The chemical liquid from the chemical liquid nozzle 51 is discharged when the on-off valve V3 is open and the on-off valve V4 is closed. At time t6, the brush 31 is kept moving without being stopped. After the pure water stops being discharged, there is a period in which no liquid is discharged onto the substrate W, until the chemical liquid is discharged; however, the upper surface of the substrate W does not get dry.

At time t7, the brush 31 arrives at the perimeter of the substrate W. At the time t7, the lift mechanism 39 raises the brush 31. With this, one cycle of brush cleaning is performed between the time t5 and the time t7.

Figure 5:
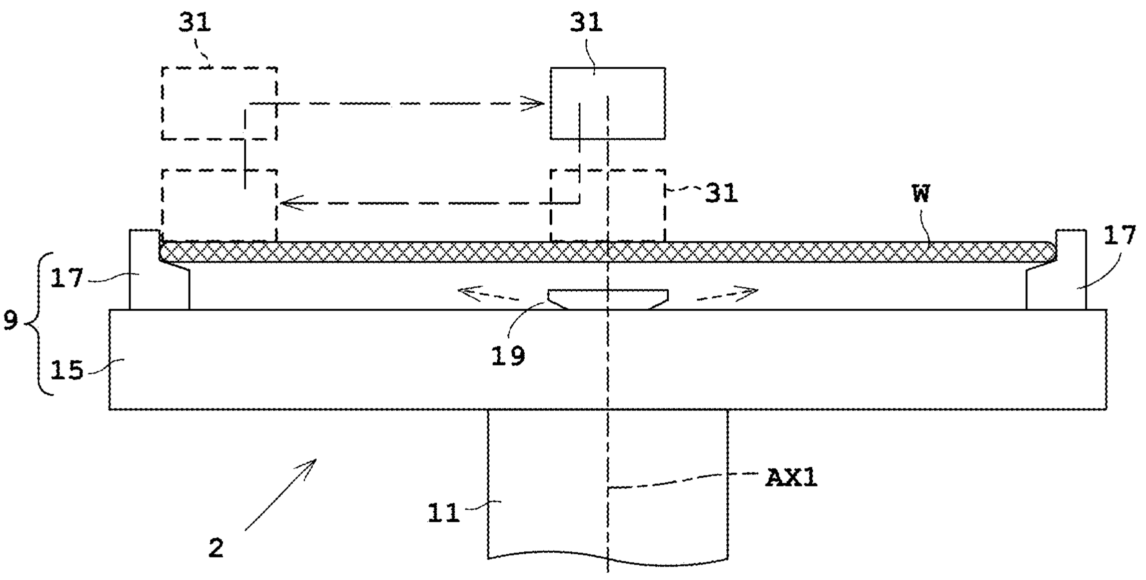
FIG. 5 is a side view illustrating the path of the brush repeating brush cleaning.

The brush cleaning is then further repeated one or more times. That is, the control unit 71 repeats the steps including the rinsing liquid/brush cleaning step, the rinsing liquid stopping step, and the chemical liquid/brush cleaning step (between the time t4 and the time t8) a preset number of times (between time t8 and time t13). In the present embodiment, brush cleaning is repeated three times (between the time t8 and the time t13), so that brush cleaning is performed four times in total. FIG. 5 is a side view illustrating the path of the brush 31 repeating brush cleaning.

At time t8, the on-off valves V3 and V4 are operated to close, to stop the discharging of the chemical liquid from the chemical liquid nozzle 51. At the time t8, the chemical liquid nozzle 51 is moved from above the center of the substrate W to the position NP. Also at the time t8, by operating the on-off valve V2 to open, pure water is discharged from the fixed nozzle 3 to the vicinity of the center of the substrate W. At time t8, the brush turning mechanism 41 moves the brush 31 from above the perimeter of the substrate W to above the center of the substrate W.

Then, between time t9 and time t10, the lift mechanism 39 starts lowering the brush 31, having been lifted from the center of the substrate W. At time t10, the lift mechanism 39 brings the brush 31 into contact with the center of the substrate W, and starts the brush cleaning. The brush turning mechanism 41 moves the brush 31 substantially simultaneously with the brush 31 coming into contact with the upper surface of the substrate W.

From time t10 to time t11, the control unit 71 moves the brush 31 from the center of the substrate W toward the perimeter of the substrate W, while keeping the brush 31 in contact with the upper surface of the substrate W and discharging pure water from the fixed nozzle 3 onto the upper surface of the substrate W being rotated (rinsing liquid/brush cleaning step). Then, when the brush 31 having moved toward the perimeter of the substrate W arrives at the switching position BP at time t11, the discharge of the pure water from the fixed nozzle 3 is stopped (rinsing liquid stopping step).

At time t11 to time t12, after the discharge of pure water is stopped, the brush 31 exerting force onto the upper surface of the substrate W is moved from the switching position BP toward the perimeter of the substrate W while discharging the chemical liquid from the chemical liquid nozzle 51 to the upper surface of the substrate W being rotated (chemical liquid/brush cleaning step). At time t12, the brush 31 arrives at the perimeter of the substrate W. At time t12, the brush 31 is lifted by the lift mechanism 39.

Note that the operation from time t10 to time t12 is substantially the same as the operation from time t5 to time t7, and thus a detailed description thereof will be omitted.

After the brush cleaning has been run four times in total, the on-off valve V3 is operated to close at time t13, and the on-off valve V4 is operated to open, to cause the chemical liquid nozzle 51 to discharge the pure water instead of the chemical liquid. At this time, the chemical liquid nozzle 51 is at above the center of the substrate W. The brush arm 5 (the brush turning mechanism 41 or the like) is also caused to move the brush 31 from above the perimeter of the substrate W to the standby position, at some timing subsequent to the time t13.

At time t14, the control unit 71 stops causing the chemical liquid nozzle 51 to discharge pure water, by operating both the on-off valves V3 and V4 to close. At the time t14, the holding and rotating unit 2 rotates the substrate W at a higher speed. For example, the rotation speed of the substrate W is, for example, 1500 rpm. In this manner, the holding and rotating unit 2 dries the substrate W by spin drying process. During the spin drying process, in order to improve the drying effect, an inert gas such as nitrogen may be blown onto the upper surface of the substrate W from a nozzle, not illustrated.

At the time t14, the nozzle turning mechanism 57 of the chemical liquid arm 7 moves the chemical liquid nozzle 51 from above the center of the substrate W to the standby position. The brush 31 and the chemical liquid nozzle 51 are moved so as not to interfere with each other.

Then, at time t15, the holding and rotating unit 2 stops rotating the substrate W. The control unit 71 also stops discharging the gas from the gas outlet 19, by operating the on-off valve V1 to close. The holding and rotating unit 2 then releases the substrate W having been held thereby. The transfer robot, not illustrated, picks up the substrate W having the rear surface cleaned, from the holding and rotating unit 2, and transfers the substrate W to a next destination.

(3) Result of Experiment

Figure 6:
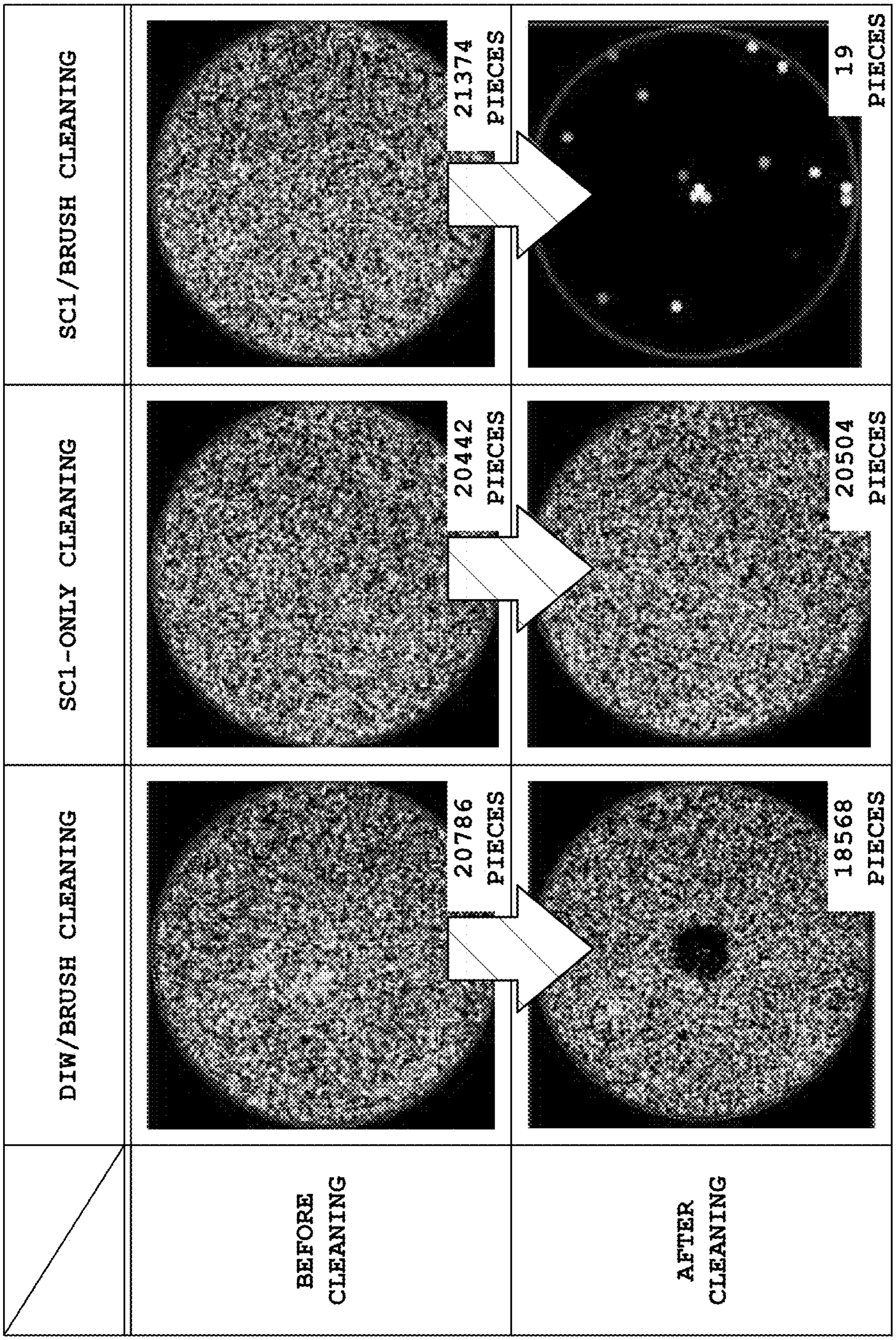
FIG. 6 is a view indicating the particle removal efficiency of DIW/brush cleaning, SC1-only cleaning (no brush cleaning), and SC1/brush cleaning.

FIG. 6 is a diagram indicating the particle removal efficiency of DIW/brush cleaning, SC1-only cleaning (no brush cleaning), and SC1/brush cleaning. In this experiment, the substrate processing apparatus 1 illustrated in FIGS. 1 and 2 was used. On a target surface of the substrate W used in the experiment, polystyrene latex (PSL) particles for the evaluation of the particle removal efficiency were attached. The diameter of the substrate W used in the experiment is 300 mm. In each section of the experiment result in FIG. 6, the number of PSL particles having a size of 50 nm or larger is indicated.

(3-1) DIW/Brush Cleaning

Figure 3:
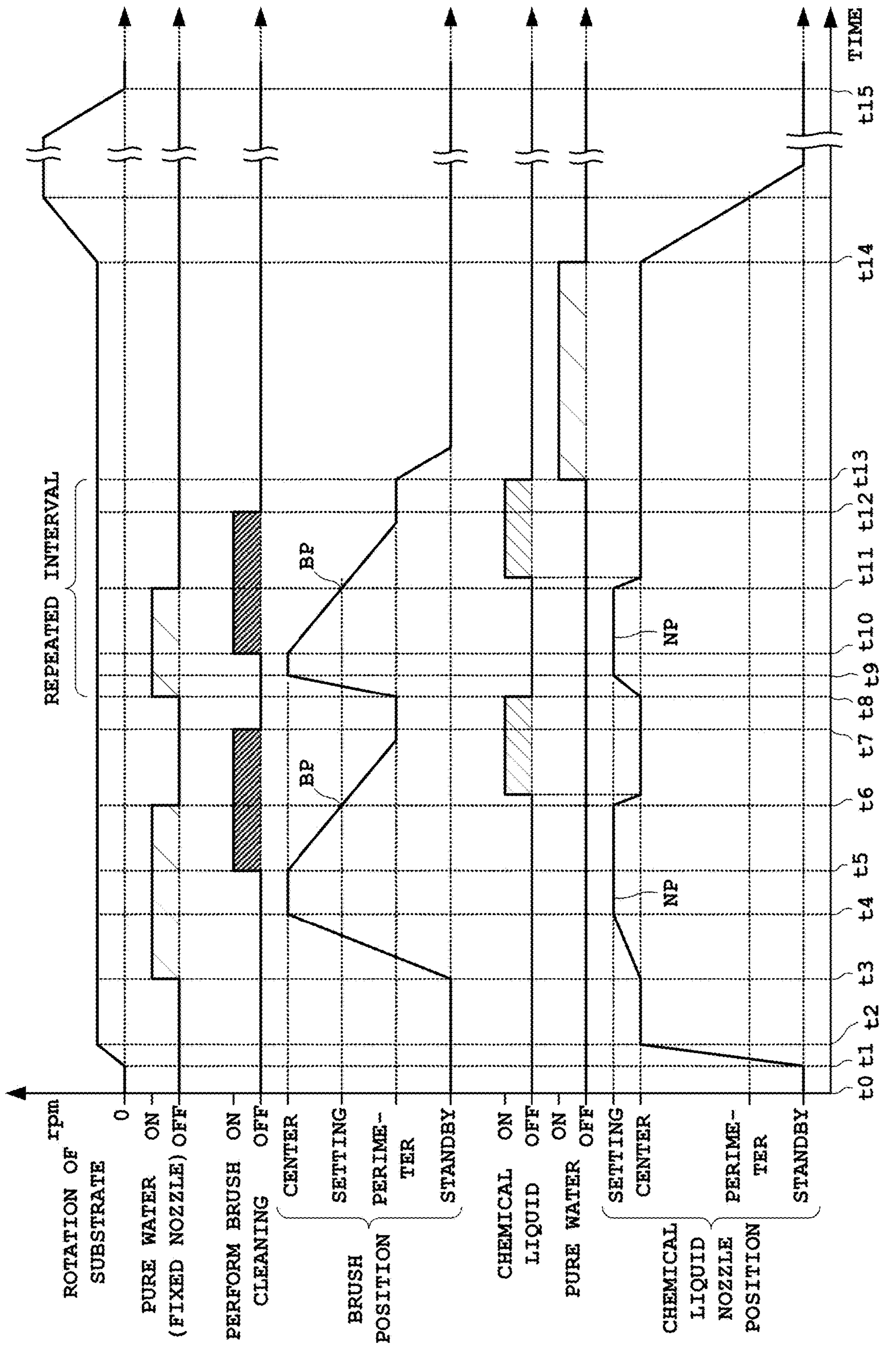
FIG. 3 is a timing chart for explaining an operation of the substrate processing apparatus.

In the DIW/brush cleaning, the substrate W is cleaned on the basis of the timing chart in FIG. 3, without using the chemical liquid nozzle 51. At this time, the substrate W is subjected to the brushing four times in total. While the brush 31 is moved from the center of the substrate W to the perimeter of the substrate W, with the brush 31 kept in contact with the substrate W, only the DIW is supplied from the fixed nozzle 3 onto the upper surface of the substrate W, without feeding the chemical liquid. The substrate W is then subjected to the rinsing process using DIW, illustrated in FIG. 3, and the spin drying process by rotating at a high speed.

As indicated in FIG. 6, with the DIW/brush cleaning, the PSL particles were removed relatively favorably in the area on the central part of the substrate W (an area larger than the diameter of the brush and surrounded by proximities of the DIW landing points). It can be inferred that, the PSL particles were relatively easily removed in the area on the central part of the substrate W, because there was an ample amount of DIW per unit area the brush 31 is kept in contact for somewhat long time.

(3-2) SC1-Only Cleaning (without Brush Cleaning)

In the SC1-only cleaning (without brush cleaning), the substrate W is rotated at 800 rpm and SC1 (chemical liquid) is discharged downwards from the chemical liquid nozzle 51 positioned above the center of the substrate W being rotated, over a predetermined time. The substrate W is then subjected to the rinsing process using DIW and the spin drying process by rotating at a high speed. The SC1-only cleaning exhibited no effect of removing the PSL particles, as indicated in FIG. 6.

(3-3) SC1/Brush Cleaning

In the SC1/brush cleaning, the substrate W is cleaned on the basis of the timing chart in FIG. 3. That is, the substrate W is subjected to the DIW/brush cleaning on the central part of the substrate W, and is subjected to the SC1/brush cleaning on the peripheral part of the substrate W. Such brush cleaning (DIW/brush cleaning and SC1/brush cleaning) was performed four times in total. The substrate W is then subjected to the rinsing process using DIW, illustrated in FIG. 3, and the spin drying process by rotating at a high speed. The total time for which SC1 was discharged over the four times of SC1/brush cleaning is shorter than the time for which SC1 is discharged in the SC1-only cleaning.

As indicated in FIG. 6, with the SC1/brush cleaning, the PSL particles were favorably removed across the entire surface of the substrate W. Therefore, it can be understood that SC1/brush cleaning exhibits higher particle removal efficiency than any of the DIW/brush cleaning and SC1-only cleaning.

According to the present embodiment, the upper surface of the substrate W is cleaned with pure water and the brush 31, on the central part of the substrate W. This way of cleaning takes advantage of the fact that, in the central part of the substrate W, the particles are removed relatively efficiently by cleaning by moving the brush 31 from the center portion of the substrate W toward the perimeter of the substrate W, while supplying pure water. After the pure water stops being discharged, the upper surface of the substrate W is cleaned by mutual effects of chemical cleaning of the chemical liquid and the physical cleaning of the brush 31. In this manner, particles on the substrate can be removed more efficiently, in the peripheral part of the substrate W. Furthermore, when the brush 31 is at the center of the substrate W, the chemical liquid nozzle 51 for discharging the chemical liquid downwards does not need to be positioned above the center of the substrate W. Therefore, it is possible to prevent the brush 31 and the chemical liquid nozzle 51 from interfering each other. Hence, the efficiency of removing particles on the substrate W can improved while preventing interference between the brush 31 and the chemical liquid nozzle 51.

Furthermore, with the particle removal efficiency improved, that is, with a greater cleaning power, the chuck mark formed on the rear surface of the substrate W, being formed by an electrostatic chuck in an extreme ultraviolet (EUV) process, can be removed. Furthermore, compared with a processing method for sequentially performing a first cleaning using the pure water and the brush 31 and a second cleaning with a chemical liquid without the brush 31, the processing time can be reduced. Furthermore, because pure water as well as the chemical liquid are used in brush cleaning, the time for which the brush 31 is exposed to the chemical liquid is reduced. Therefore, the lifetime of the brush 31 can be extended. Furthermore, because the chemical liquid is not supplied while the brush 31 is exerting force onto the central part of the substrate W, the used amount of chemical liquid can be reduced.

The rinsing liquid/brush cleaning step, the rinsing liquid stopping step, and the chemical liquid/brush cleaning step are repeated a preset number of times (time t4 to time t8, time t8 to time t13). With the chemical liquid supplied on the upper surface of the substrate W, the adhesion force of particles is decreased, so that the particles can be easily removed by brush cleaning. Therefore, by repeating the rinsing liquid/brush cleaning step, the rinsing liquid stopping step, and the chemical liquid/brush cleaning step, the efficiency of particle removal is improved.

The chemical liquid nozzle 51 is moved to the preset position NP above the substrate W, the preset position NP being a position not interfering with the brush 31, before the brush 31 starts exerting force onto the center of the upper surface of the substrate W. It is possible to keep the distance for moving the chemical liquid nozzle 51 short, when the chemical liquid nozzle 51 is moved to above the center of the substrate W.

Furthermore, when the brush 31 having moved toward the perimeter of the substrate W arrives at the switching position BP, the chemical liquid nozzle 51 is caused to move above the center of the substrate W. Furthermore, the switching position BP is at a position where the brush 31 does not interfere with the chemical liquid nozzle 51 while the chemical liquid nozzle 51 is at above the center of the substrate W. The chemical liquid nozzle 51 is allowed to move when the brush 31 arrives at the switching position BP where the brush 31 does not interfere with the chemical liquid nozzle 51.

The present invention is not limited to the embodiments described above, and following modifications are still possible.

Figure 7:
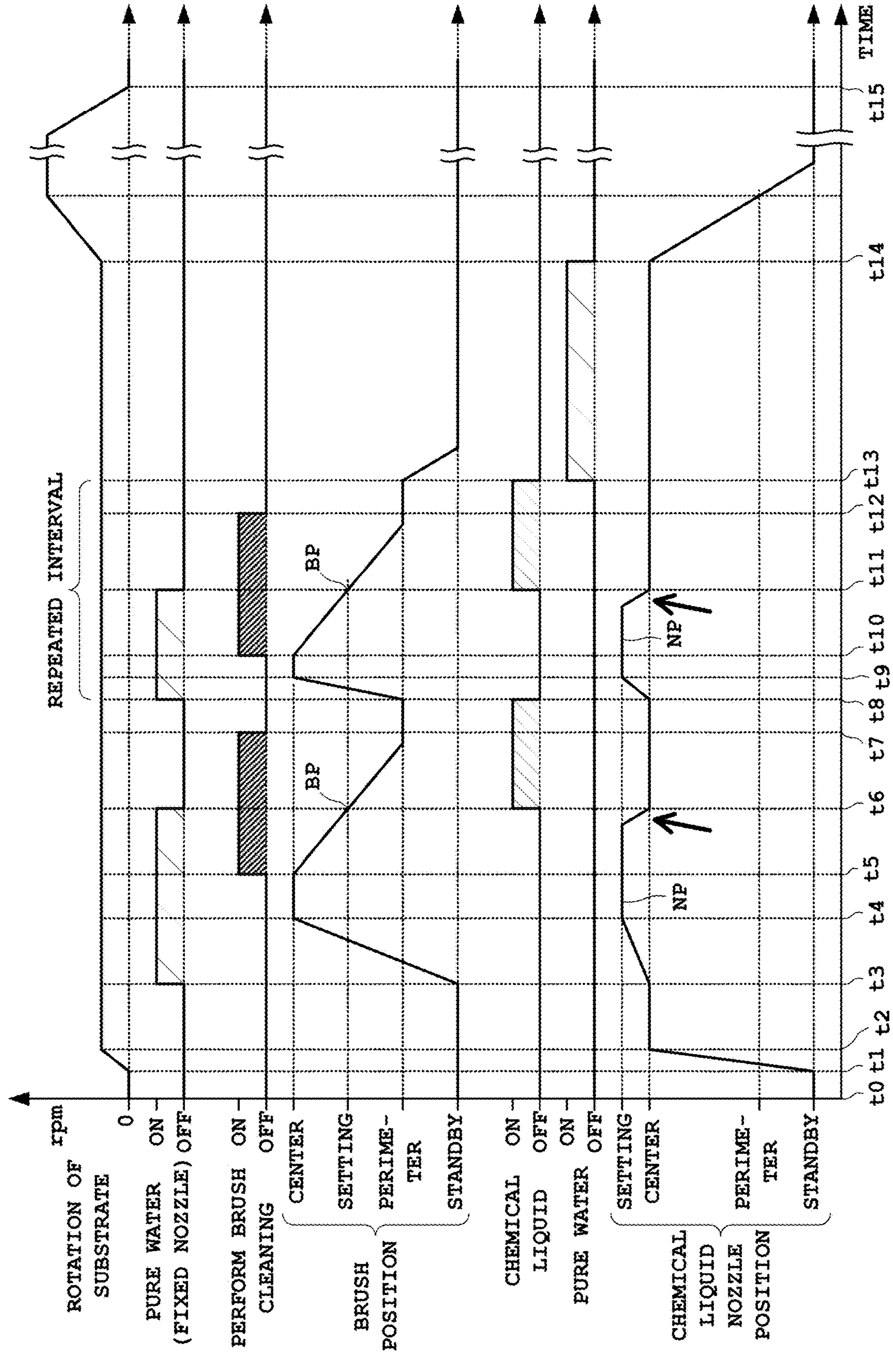
FIG. 7 is a timing chart for explaining an operation of the substrate processing apparatus according to a modification.

(1) In the embodiment described above, in FIG. 3, when the brush 31 having moved toward the perimeter of the substrate W arrives at the switching position BP, the chemical liquid nozzle 51 is caused to start moving toward above the center of the substrate W. In this regard, the chemical liquid nozzle 51 may be caused to start moving before the brush 31 arrives at the switching position BP, between the time t5 and the time t6 indicated by the arrows in FIG. 7. Then, at the time t6 in FIG. 7, the chemical liquid nozzle 51 may arrive at above the center of the substrate W.

In such a configuration, the control unit 71 may cause the nozzle turning mechanism 57 to move the chemical liquid nozzle 51 toward above the center of the substrate W while keeping the chemical liquid nozzle 51 in a manner not interfering with the brush 31, during the rinsing liquid (pure water)/brush cleaning. With this, it is possible to discharge the chemical liquid from the chemical liquid nozzle 51 toward the center of the substrate W, immediately after the brush 31 arrives at the switching position BP and the discharge of the pure water from the fixed nozzle 3 is stopped.

Figure 8:
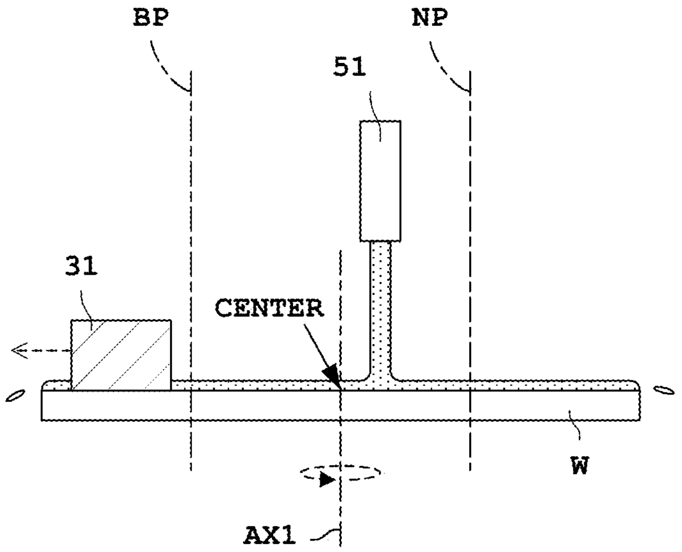
FIG. 8 is a side view for explaining another modification.

(2) In the embodiment and modification (1) described above, after the chemical liquid nozzle 51 arrives above the center of the substrate W (vertically above), the chemical liquid is discharged downwards from the chemical liquid nozzle 51 onto the center of the substrate W. With this, the chemical liquid lands on the center of the substrate W. In this regard, the chemical liquid may land on any position offset from the center of the substrate W as long as the center of the substrate W is covered by the chemical liquid having landed on the substrate W. Therefore, as illustrated in FIG. 8, the chemical liquid nozzle 51 may be offset from a position vertically above the center of the substrate W.

In other words, to perform the chemical liquid/brush cleaning, the control unit 71 may move the brush 31 that is in contact with the upper surface of the substrate W toward the perimeter of the substrate W while causing the chemical liquid nozzle 51 to discharge the chemical liquid onto the upper surface of the substrate W in such a manner that the chemical liquid having landed on the upper surface of the substrate W being rotated covers the center of the substrate W. Therefore, with the rotation of the substrate W, the chemical liquid is allowed to spread evenly from the center of the substrate W.

(3) In the embodiment and each of the modifications described above, the chemical liquid nozzle 51 is configured to be movable from the position NP that is the retracted position offset from the center of the substrate W toward the center of the substrate W, but the retracted position is not limited to the position NP. The retracted position may be the standby position outside the substrate W, for example.

(4) In the embodiment and each of the modifications described above, the pure water is discharged from the chemical liquid nozzle 51 between the time t13 and the time t14 in FIG. 3. In this regard, pure water may also be discharged from the fixed nozzle 3.

(5) In the embodiment and each of modifications described above, the fixed nozzle 3 and the chemical liquid nozzle 51 discharge pure water as the rinsing liquid, but the rinsing liquid is not limited to the pure water. The rinsing liquid may be, for example, carbonated water, hydrogen water, or electrolytic ion water.

(6) In the embodiment and each of the modifications described above, the switching position BP is a position at a distance of a half the radius (e.g., 150 mm) of the substrate W, but is not limited to this position. For example, the position may be closer to the central part of the substrate W than the position at a half the radius of the substrate W, as long as the chemical liquid nozzle 51 does not interfere with the brush 31 when the chemical liquid nozzle 51 is at above the center of the substrate W. In this manner, it is possible to switch from the rinsing liquid/brush cleaning to the chemical liquid/brush cleaning quickly.

(7) In the embodiment and each of the modifications described above, the brush cleaning is repeated three times, so that the brush cleaning is performed four times in total. In this regard, it is not necessary for the brush cleaning to be repeated, as long as sufficient particle removal efficiency can be achieved by one brush cleaning. An example of such a case include a configuration in which the area where the particle removal efficiency of the rinsing liquid/brush cleaning is high (see FIG. 6) overlaps with the area where the chemical liquid/brush cleaning is performed.

(8) In the embodiment and each of the modifications described above, the brush 31 is made of a fluororesin such as PTFE. In this respect, optionally, the brush 31 may be made of a polyvinyl alcohol (PVA) sponge. The brush 31 may be configured as a plurality of bristle bundles implanted in a member.

(9) In the embodiment and each of the modifications described above, the brush 31 performs the brush cleaning by exerts force onto the upper surface of the substrate W while being in contact. In this regard, the brush 31 may perform brush cleaning of the upper surface of the substrate W in a non-contact fashion so that the space for the chemical liquid or pure water is ensured between the lower surface of the brush 31 and the upper surface of the substrate W.

Figure 9:
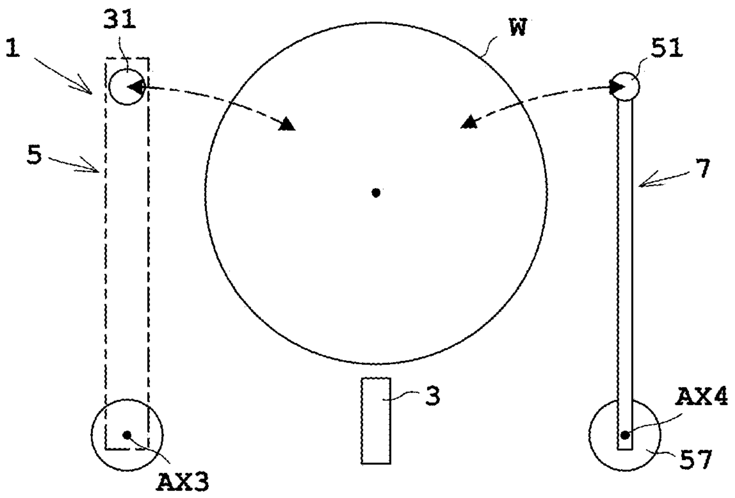
FIG. 9 is a plan view of the substrate processing apparatus according to another modification.

(10) In the embodiment and each of the modifications described above, as illustrated in FIG. 2, the brush arm 5 and the chemical liquid arm 7 are disposed in an L shape at the standby position. In this regard, as illustrated in FIG. 9, the brush arm 5 and the chemical liquid arm 7 may be disposed in parallel with each other at the standby position. Furthermore, in FIG. 9, the chemical liquid nozzle 51 and the nozzle turning mechanism 57 may be disposed at opposite positions.

(11) In the embodiment and each of modifications described above, the brush turning mechanism 41 serving as the brush moving mechanism turns the brush 31 about the vertical axis AX3. In this regard, the brush moving mechanism may also be configured to move the brush 31 linearly in the horizontal direction. The brush moving mechanism may be also configured to move the brush 31 in the X direction and the Y direction. The same applies to the chemical liquid nozzle 51.

(12) In the embodiment and each of the modifications described above, the chemical liquid discharged from the chemical liquid nozzle 51 and landing on the upper surface of the substrate W does not need to spread to reach the center of the substrate W, as required.

REFERENCE SIGNS LIST

1 substrate processing apparatus
2 holding and rotating unit
3 fixed nozzle
5 brush arm
7 chemical liquid arm
31 brush
41 brush turning mechanism
51 chemical liquid nozzle
57 nozzle turning mechanism
AX1 to AX4 vertical axis
NP position
BP switching position

The invention claimed is:

1. A substrate processing method for processing a substrate using a substrate processing apparatus, the substrate processing apparatus including:

a spin chuck that holds and rotates a substrate in a horizontal orientation;

a brush that is movable from a center of the substrate toward a perimeter of the substrate and performs brush cleaning by exerting force onto an upper surface of the substrate;

a rinsing liquid nozzle that is provided at a fixed position offset from the center of the substrate and discharges a rinsing liquid onto the upper surface of the substrate; and a chemical liquid nozzle that is movable from a retracted position offset from the center of the substrate toward the center of the substrate, and that discharges a chemical liquid downwards onto the upper surface of the substrate from above the center of the substrate, the substrate processing method comprising:

(a) moving the brush exerting force on the upper surface of the substrate being rotated by the spin chuck from the center of the substrate toward the perimeter of the substrate, while causing the rinsing liquid nozzle to discharge the rinsing liquid onto the upper surface;

(b) stopping discharge of the rinsing liquid from the rinsing liquid nozzle when the brush having moved toward the perimeter of the substrate arrives at a switching position set in advance between the center of the substrate and the perimeter of the substrate; and (c) moving, after (b) stopping discharge of the rinsing liquid from the rinsing liquid nozzle, the brush exerting force on the upper surface of the substrate from the switching position toward the perimeter of the substrate while causing the chemical liquid nozzle to discharge the chemical liquid onto the upper surface of the substrate being rotated.

2. The substrate processing method according to claim 1, wherein (a) moving the brush exerting force on the upper surface of the substrate, (b) stopping discharge of the rinsing liquid from the rinsing liquid nozzle, and (c) moving, after stopping discharge of the rinsing liquid from the rinsing liquid nozzle, the brush exerting force on the upper surface of the substrate are repeated a preset number of times.

3. The substrate processing method according to claim 1, further comprising (d) moving the chemical liquid nozzle to a preset position above the substrate, the preset position being a position not interfering with the brush, before the brush exerts force onto the upper surface of the center of the substrate.

4. The substrate processing method according to claim 1, wherein, in (c) moving, after stopping the discharge of the rinsing liquid from the rinsing liquid nozzle, the brush exerting force on the upper surface of the substrate, the brush exerting force on the upper surface of the substrate is moved from the switching position toward the perimeter of the substrate while causing the chemical liquid nozzle to discharge the chemical liquid onto the upper surface of the substrate in a manner allowing the chemical liquid landed on the upper surface of the substrate being rotated to cover the center of the substrate.

5. The substrate processing method according to claim 1, wherein the brush is configured to perform brushing by exerting force while in contact with the upper surface of the substrate, and the substrate comprising a semiconductor substrate, a substrate for a flat panel display, a glass substrate for a photomask, a substrate for an optical disk, a substrate for a magnetic disk, a ceramic substrate, or a substrate for a solar cell.

6. The substrate processing method according to claim 2, further comprising moving the chemical liquid nozzle to above the center of the substrate when the brush having moved toward the perimeter of the substrate arrives at the switching position, wherein the switching position is a position where the brush does not interfere with the chemical liquid nozzle positioned at above the center of the substrate.

7. The substrate processing method according to claim 3, further comprising moving the chemical liquid nozzle to above the center of the substrate while (c) moving, after stopping discharge of the rinsing liquid from the rinsing liquid nozzle, the brush exerting force on the upper surface of the substrate, in a manner maintaining the chemical liquid nozzle not interfering with the brush.

* * * * *